United States Patent
Zafiropoulo et al.

(10) Patent No.: US 9,318,319 B2
(45) Date of Patent: Apr. 19, 2016

(54) RADICAL-ENHANCED ATOMIC LAYER DEPOSITION USING $CF_4$ TO ENHANCE OXYGEN RADICAL GENERATION

(71) Applicant: Ultratech, Inc., San Jose, CA (US)

(72) Inventors: Arthur W. Zafiropoulo, Atherton, CA (US); Mark J. Sowa, Medford, MA (US)

(73) Assignee: Ultratech, Inc., San Jose, CA (US)

( * ) Notice: Subject to any disclaimer, the term of this patent is extended or adjusted under 35 U.S.C. 154(b) by 0 days.

(21) Appl. No.: 14/744,409

(22) Filed: Jun. 19, 2015

(65) Prior Publication Data

US 2016/0064208 A1    Mar. 3, 2016

Related U.S. Application Data

(60) Provisional application No. 62/042,686, filed on Aug. 27, 2014.

(51) Int. Cl.
*H01L 21/469*    (2006.01)
*H01L 21/02*    (2006.01)

(52) U.S. Cl.
CPC ...... *H01L 21/0228* (2013.01); *H01L 21/02205* (2013.01); *H01L 21/02216* (2013.01); *H01L 21/02274* (2013.01)

(58) Field of Classification Search
CPC .............. H01L 21/0228; H01L 21/02205; H01L 21/02216
See application file for complete search history.

(56) References Cited

U.S. PATENT DOCUMENTS

| | | | |
|---|---|---|---|
| 6,200,893 B1 | 3/2001 | Sneh | |
| 7,382,087 B2 | 6/2008 | Tabata et al. | |
| 7,402,534 B2 | 7/2008 | Mahajani | |
| 7,708,969 B2 | 5/2010 | Won et al. | |
| 2006/0228888 A1 | 10/2006 | Lee et al. | |
| 2012/0255612 A1* | 10/2012 | Pierreux | H01L 21/02178 136/261 |
| 2013/0022744 A1 | 1/2013 | Kil et al. | |
| 2013/0091926 A1 | 4/2013 | Shao et al. | |
| 2013/0270103 A1 | 10/2013 | Shao et al. | |

(Continued)

OTHER PUBLICATIONS

Chen et al., "Optimization of fluourine plasma treatment for interface improvement of $HfO_2/IN_{0.53}Ga_{0.47}As$ MOSFETs," Appl. Sci., 2012, pp. 233-244 (Mar. 19, 2012).

(Continued)

*Primary Examiner* — Bradley K Smith
(74) *Attorney, Agent, or Firm* — Opticus IP Law PLLC

(57) ABSTRACT

A method of performing a radical-enhanced atomic-layer deposition process on a surface of a substrate that resides within an interior of a reactor chamber is disclosed. The method includes forming plasma from a gas mixture consisting of $CF_4$ and $O_2$, wherein the $CF_4$ is present in a concentration in the range from 0.1 vol % to 10 vol %. The plasma formed from the gas mixture generates oxygen radicals O* faster than if there were no $CF_4$ present in the gas mixture. The method also includes feeding the oxygen radicals and a precursor gas sequentially into the interior of the reactor chamber to form an oxide film on the surface of the substrate. A system for performing the radical-enhanced atomic-layer deposition process using the rapidly formed oxygen radicals is also disclosed.

20 Claims, 2 Drawing Sheets

(56) References Cited

U.S. PATENT DOCUMENTS

2014/0225502 A1* 8/2014 Kang .................... C23C 16/452
 315/111.21
2015/0091134 A1* 4/2015 Amaratunga ......... C23C 16/405
 257/532
2015/0279665 A1* 10/2015 Zafiropoulo ...... H01L 21/02274
 438/785

OTHER PUBLICATIONS

Profijt et al., "Plasma-assisted atomic layer deposition: Basics, opportunities, and challenges," J. Vac. Sci. Technol., A 29(5) Sep./Oct. 2011, pp. 050801-1 to 26.

* cited by examiner

US 9,318,319 B2

RADICAL-ENHANCED ATOMIC LAYER DEPOSITION USING $CF_4$ TO ENHANCE OXYGEN RADICAL GENERATION

CROSS-REFERENCE TO RELATED APPLICATIONS AND PRIORITY CLAIM

This Application claims priority under 35 USC §119(e) from U.S. Provisional Patent Application Ser. No. 62/042,686, filed on Aug. 27, 2014, and which is incorporated by reference herein.

FIELD

The present disclosure relates to atomic layer deposition (ALD), and in particular relates to radical-enhanced ALD (RE-ALD), and more particularly to RE-ALD wherein a relatively small amount of $CF_4$ is used in combination with oxygen to substantially enhance the generation of oxygen radicals to speed up the RE-ALD process.

The entire disclosure of any publication or patent document mentioned herein is incorporated by reference, including the article by Profijt et al., entitled "Plasma-Assisted Atomic Layer Deposition: Basics, Opportunities, and Challenges," J. Vac. Sci. Technol. A 29(5), Sep/Oct 2011, pp 050801-1 to 26, and the article by George, entitled "Atomic Layer Deposition: an Overview," Chem. Rev. 2010, 110, pp 111-113 (published on the Web on Nov. 20, 2009).

BACKGROUND

Atomic layer deposition (ALD) is a method of depositing a thin film on a substrate in a very controlled manner. The deposition process is controlled by using two or more chemicals ("precursors") in vapor form and reacting them sequentially and in a self-limiting manner on the surface of the substrate. The sequential process is repeated to build up the thin film layer by layer, wherein the layers are atomic scale.

ALD is used to form a wide variety of films, such as binary, ternary and quaternary oxides for advanced gate and capacitor dielectrics, as well as metal-based compounds for interconnect barriers and capacitor electrodes.

One type of ALD is called radical-enhanced ALD (RE-ALD). The RE-ALD utilizes radicals generated by a plasma to form one of the precursor gases. Because a radicalized precursor tends to be more reactive than its unradicalized counterpart, it helps induce the reactions when forming the film layers.

The type of plasma used in the RE-ALD is referred to by the name of the feedgas used to form the plasma. For example, an "oxygen plasma" utilizes oxygen ($O_2$) as the feedgas to produce a plasma that generates oxygen-radical precursors. The oxygen-radical precursors comprise monatomic oxygen, which has two unpaired electrons that make monatomic oxygen very reactive. The oxygen radicals serve as co-reactants that are used in conjunction with a second precursor (say, an Si-based precursor such tris(dimethylamino)silane). The two precursors are feed sequentially into the reactor chamber to produce sequential layers that lead to thin film growth (e.g., $SiO_2$).

While ALD has many advantages, one of its major disadvantages as compared to other film growth processes (such as chemical-vapor deposition or CVD) is that it is quite slow. For example, a conventional ALD reactor has a growth rates measured in angstroms/minute, while CVD has growth rates measured in microns/minute. Slow growth rates result in excellent film quality but limit the throughput of processed substrates (wafers) in a semiconductor manufacturing line. Thus, while an oxygen plasma is effective in providing oxygen-radical precursors for oxygen-based RE-ALD, there is always a need to increase the speed and/or efficiency of an oxygen-based RE-ALD process.

SUMMARY

An aspect of the disclosure is a method of performing a RE-ALD process on a surface of a substrate that resides within an interior of a reactor chamber. The method includes: providing a gas mixture of $CF_4$ gas and $O_2$ gas, wherein the $CF_4$ gas is present in a concentration in the range from 0.1 vol % to 10 vol %; forming a plasma from the gas mixture to generate oxygen radicals at a rate faster than if there were no $CF_4$ gas present in the gas mixture; and sequentially feeding the oxygen radicals and a precursor gas into the interior of the reactor chamber to form an oxide film on the surface of the substrate.

Another aspect of the disclosure is the method as described above, wherein the plasma is preferably formed within a plasma tube that is pneumatically coupled to the interior of the reactor chamber.

Another aspect of the disclosure is the method as described above, wherein the precursor gas preferably comprises a metal organic precursor.

Another aspect of the disclosure is the method as described above, wherein the metal organic precursor is preferably selected from the group consisting of: silicon, aluminum, hafnium, titanium, zirconium, tantalum, yttrium and magnesium.

Another aspect of the disclosure is the method as described above, wherein the oxide film preferably comprises a metal oxide.

Another aspect of the disclosure is the method as described above, wherein the metal oxide is preferably selected from the group consisting of: $Al_2O_3$, $B_2O_3$, $CeO_2$, $Co_3O_4$, $Cr_2O_3$, $CuO_x$, $Er_2O_3$, $FeO_x$, $Ga_2O_3$, $Gd_2O_3$, $HfO_2$, $IrO_2$, $La_2O_3$, $MgO$, $Nb_2O_5$, $NiO_x$, $PtO_2$, $RuO_2$, $SiO_2$, $SnO_2$, $SrO_x$, $Ta_2O_5$, $TiO_2$, $Tm_2O_3$, $V_2O_5$, $Y_2O_3$, $ZnO$ and $ZrO_2$.

Another aspect of the disclosure is the method as described above, wherein the method preferably further includes introducing a purge gas into the interior of the reactor chamber to assist in purging the interior of the reactor chamber of either the oxygen radicals or the precursor gas.

Another aspect of the disclosure is the method as described above, wherein the substrate preferably comprises a silicon wafer.

Another aspect of the disclosure is a method of performing a RE-ALD process on a surface of a substrate that resides within an interior of a reactor chamber. The method includes: providing a first precursor gas comprising oxygen radicals O* by forming an oxygen plasma from a gas mixture within a plasma tube, wherein the plasma tube is pneumatically coupled to the interior of the reactor chamber, and wherein the gas mixture consists of $CF_4$ gas and $O_2$ gas, wherein the $CF_4$ gas has a concentration of 0.1 vol % to 10 vol %; providing a second precursor gas from a gas source that is pneumatically coupled to the interior of the reactor chamber; and sequentially introducing the first precursor gas and the second precursor gas into the interior of the reactor chamber to form an oxide film on the surface of the substrate.

Another aspect of the disclosure is the method as described above, wherein one of the first and second precursor gases preferably comprises at least one of: silicon, aluminum, hafnium, titanium, zirconium, tantalum, yttrium and magnesium.

Another aspect of the disclosure is the method as described above, wherein the oxide film preferably comprises one of: $SiO_2$, $Al_2O_3$, $HfO_2$, $TiO_2$, $ZrO_2$, $Ta_2O_5$, $Y_2O_3$ and $MgO$.

Another aspect of the disclosure is the method as described above, wherein the method further includes introducing a purge gas into the interior of the reactor chamber to assist in purging the interior of the reactor chamber of either the first precursor gas or the second precursor gas.

Another aspect of the disclosure is the method as described above, wherein the substrate preferably comprises a silicon wafer.

Another aspect of the disclosure is the method as described above, wherein the plasma tube is preferably made of quartz.

Another aspect of the disclosure is the method as described above, wherein forming the oxygen plasma preferably includes subjecting the gas mixture in the plasma tube to inductive coupling.

Another aspect of the disclosure is a system for performing a RE-ALD process on a surface of a substrate. The system includes: a reactor chamber having an interior configured to support the substrate; a gas source pneumatically coupled to the interior of the reactor chamber and that contains a gas mixture consisting of $CF_4$ and $O_2$, wherein the $CF_4$ has a concentration in the gas mixture of 0.1 vol % to 10 vol %; a plasma system pneumatically connected to the interior of the reactor chamber and configured to form from the gas mixture a plasma that generates oxygen radicals O* faster than if the gas mixture did not contain $CF_4$; a vacuum pump pneumatically connected to the interior of the reactor chamber; and a controller operably connected to the plasma system, the vacuum pump and the gas source, the controller being configured to introduce the oxygen radicals and a precursor gas sequentially into the interior of the reactor chamber to form an oxide film on the surface of the substrate.

Another aspect of the disclosure is the system as described above, wherein the precursor gas preferably includes one of: silicon, aluminum, hafnium, titanium, zirconium, tantalum, yttrium and magnesium.

Another aspect of the disclosure is the system as described above, wherein the plasma system preferably includes an inductively coupled plasma source.

Another aspect of the disclosure is the system as described above, wherein the system preferably further includes the substrate. The substrate preferably comprises silicon.

Another aspect of the disclosure is the system as described above, wherein the gas source preferably includes operably coupled first and second gas sources. The first gas source preferably contains the $O_2$ gas and the second gas source preferably contains the $CF_4$ gas.

Another aspect of the disclosure is a RE-ALD method that includes exposing a substrate to a first precursor chemical that reacts with the surface of the substrate to form a chemisorbed monolayer followed by a first purging step, which removes excess precursor and reaction products. Next, oxygen radicals O* produced from a plasma source are delivered to the surface of substrate, reacting with the chemisorbed monolayer, creating an atomic scale layer of the desired material. The method also includes preparing the surface such that it will again be reactive with the first precursor chemical. This can include performing a second purge step. The above process is repeated to build up atomic-scale layer of the desired material to a desired final thickness. The method also includes forming the oxygen radicals O* using a feedgas gas mixture of $CF_4$ and $O_2$ to form an oxygen plasma as described below, with the $CF_4$ having a concentration in the range from 0.1 vol % to 10 vol %. In an example, the desired material is an oxide such as a metal oxide.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

In the discussion herein, an oxygen radical is denoted as O* and represents monatomic oxygen, which has a total of six electrons, two of which are unpaired. The unpaired electrons make O* very reactive, i.e., more reactive than diatomic oxygen ($O_2$).

In the discussion below, the oxygen radicals O* constitute a first precursor gas that serves as an oxidizing precursor, while a second precursor gas is a non-oxide gas that forms, in combination with the first precursor gas, a thin-film oxide compound on a surface of substrate.

Figure 1:
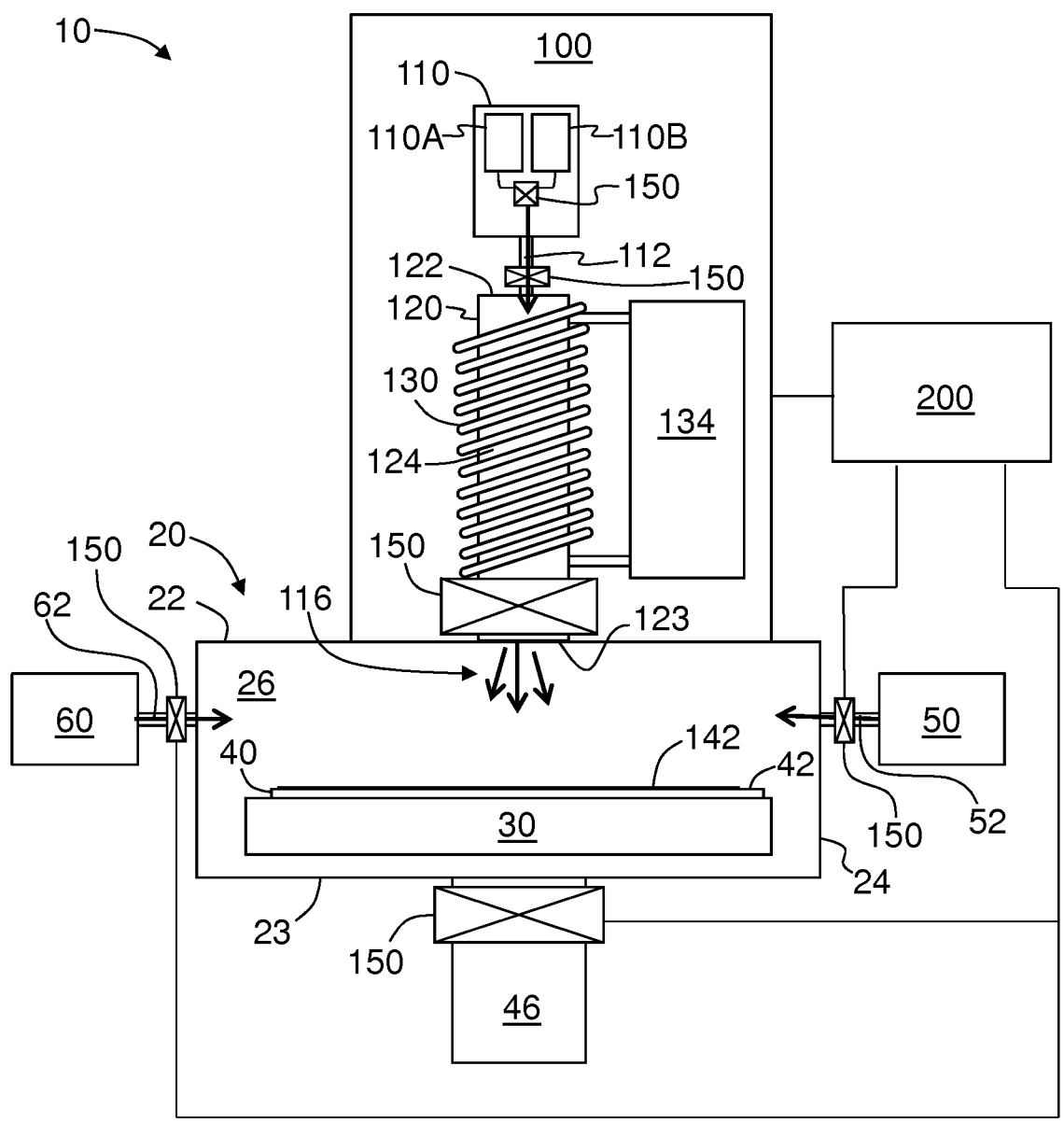
FIG. 1 is a schematic diagram of an example RE-ALD system used to carry out the RE-ALD methods disclosed herein that employ a select mixture of $O_2$ and $CF_4$ gases to generate a precursor gas having monatomic oxygen radicals O*.

FIG. 1 is a schematic diagram of an example RE-ALD system 10. Various configurations for the RE-ALD system 10 are possible, and the RE-ALD system 10 of FIG. 1 shows one basic configuration that can be employed. The RE-ALD system 10 includes a reactor chamber 20 having a top wall 22, a bottom wall 23 and a cylindrical sidewall 24 that define a reactor chamber interior 26. A stage 30 resides within the reactor chamber interior 26. The stage 30 supports a substrate 40 that has an upper surface 42 on which an oxide film 142 is formed via a RE-ALD process as discussed below. An example substrate 40 is a silicon wafer used in semiconductor manufacturing. Other example substrates 40 include GaAs, GaN, glass, and polymers, such as polyimide.

The RE-ALD system 10 also includes a vacuum pump 46 that is pneumatically connected to the reactor chamber interior 26 and serves to control the pressure within the reactor chamber interior 26 (e.g., in the range of about 10 mTorr to about 500 mTorr).

The RE-ALD system 10 also includes a precursor gas source 50 that is pneumatically connected to the reactor chamber interior 26 and that provides a precursor gas 52 to the reactor chamber interior 26 as part of the RE-ALD process. In an example, the precursor gas 52 is any gas that combines with oxygen to form an oxide film 142 on the upper surface 42 of substrate 40. Example first precursor gases include: silicon-based precursors (e.g., to form $SiO_2$), aluminum-based precursors (e.g., to form $Al_2O_3$), hafnium-based precursors (e.g., to form $HfO_2$), titanium-based precursors (e.g., to form $TiO_2$), zirconium-based precursors (e.g., to form $ZrO_2$), tantalum-based precursors (e.g., to form $Ta_2O_5$), Yttrium-based precursors (e.g., to form $Y_2O_3$) and magnesium-based precursors (e.g., to form $Mg_2O_4$ or MgO). Examples precursor gasses 52 therefore include:

Si—tris(dimethylamino)silane
Al—trimethyl aluminum
Hf—tetrakis(dimethylamido)hafnium
Ti—titanium tetrachloride
Zr—tetrakis(dimethylamido)zirconium
Ta—pentakis(dimethylamido)tantalum
Yt—Tris(2,2,6,6-tetramethyl-3,5-heptanedionato)yttrium
Mg—Ethylcyclopentadienyl(magnesium)

In an example, the oxide film 142 is a metal oxide, and further in an example is a metal oxide selected from the following group of metal oxides and formed using a suitable precursor gas 52: $Al_2O_3$, $B_2O_3$, $CeO_2$, $Co_3O_4$, $Cr_2O_3$, $CuO_x$, $Er_2O_3$, $FeO_x$, $Ga_2O_3$, $Gd_2O_3$, $HfO_2$, $IrO_2$, $La_2O_3$, MgO, $Nb_2O_5$, $NiO_x$, $PtO_2$, $RuO_2$, $SiO_2$, $SnO_2$, $SrO_x$, $Ta_2O_5$, $TiO_2$, $Tm_2O_3$, $V_2O_5$, $Y_2O_3$, ZnO and $ZrO_2$.

The RE-ALD system 10 further includes an optional second gas source 60 that is pneumatically connected to the reactor chamber interior 26 and that provides an inert gas 62 to the reactor chamber interior 26. The inert gas 62 serves as a purge gas between introducing the different precursor gasses to speed up the sequential layering processes when forming the oxide film 142. Note that the second gas source 60 can be combined with the precursor gas source 50 so that the precursor gas 52 and the inert gas 62 can flow into the reactor chamber interior 26 through the same conduit.

Figure 2:
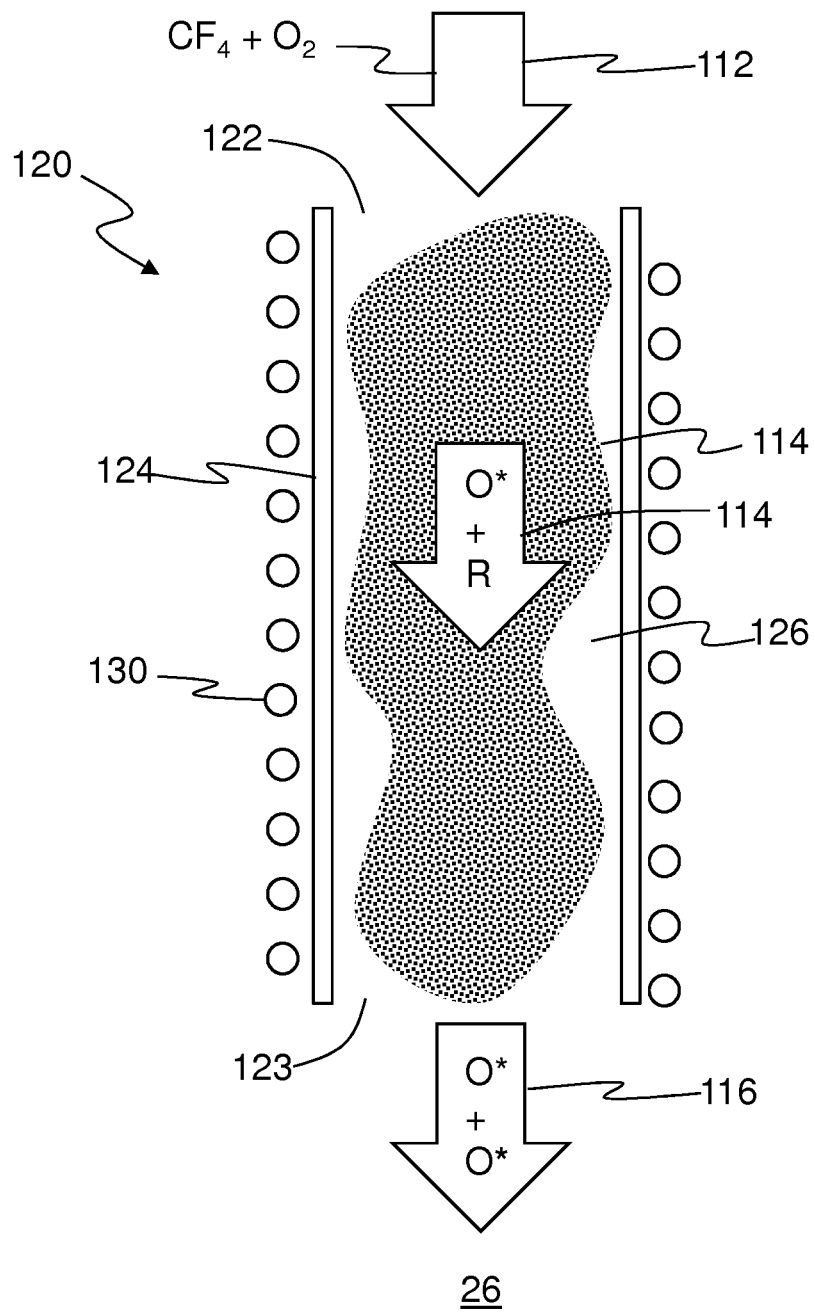
FIG. 2 is a close-up cross-sectional view of the plasma system of the RE-ALD system of FIG. 1 illustrating how the oxygen molecule $O_2$ in the $O_2$ and $CF_4$ gas mixture is dissociated into two monatomic oxygen radicals (O*+O*) within the plasma system, along with residual species denoted R.

The RE-ALD system 10 also includes an oxygen plasma system 100 that is pneumatically coupled to the reactor chamber interior 26. FIG. 2 is a close-up cross-sectional view of a portion of an example oxygen plasma system 100. The oxygen plasma system 100 is configured to receive a gas mixture 112 of $O_2$ and $CF_4$ gasses as a feedgas to form a plasma 114. The production of plasma 114 is a complex process that produces many species. For example, in the present case, the $O_2$ and $CF_4$ of gas mixture 112 dissociate into $O_2^+$, $O^-$, O, $O2^-$, $O_3$, $O^*$, $CF_3$, $CF_3^-$, $CF_3^+$, $CF_2$, F and $F^-$. For simplicity, the plasma 114 is referred to herein as "oxygen plasma" 114 for ease of discussion and because oxygen is the main feedgas used. The species other than the particular oxygen radicals O* species of interest are considered herein as residual species and are collectively denoted as R in FIG. 2.

As noted above, the oxygen plasma 114 generates the oxygen radicals O* that enter the reactor chamber interior 26 and that constitute an oxidizing precursor gas 116. In an example, the gas mixture 112 has 0.1 vol % to 10 vol % $CF_4$, with the rest of the gas mixture 112 being $O_2$. In another example, the gas mixture 112 has 1% vol to 10% vol $CF_4$, with the rest of the gas mixture 112 being $O_2$. In other examples, small amounts of other gasses may be present in the gas mixture 112 without substantially reducing the improved oxygen radicals O* generation provided by the presence of the $CF_4$ gas.

An example oxygen plasma system 100 includes a gas source 110 configured to deliver the gas mixture 112. In an example, the gas source 110 includes an $O_2$ gas source 110A and a $CF_4$ gas source 110B that are operably connected so that the two gases can be mixed to form the gas mixture 112. In another example, the gas source 110 includes a single gas source that includes the gas mixture 112.

The gas source 110 is pneumatically coupled to an input end 122 of a plasma tube 120. The plasma tube 120 also has an output end 123, an outer surface 124 and an interior 126. An example plasma tube 120 is made of quartz and is substantially cylindrical. Other known materials can be used for plasma tube 120. A radio-frequency (RF) coil 130 resides around the outer surface 124 of plasma tube 120 and is operably connected to an RF source 134 that includes an RF-matching network.

The RE-ALD system 10 includes a number of valves 150 to control the flow of the precursor gas 52, the inert gas 62 as a purge gas, the gas mixture 112 (including the formation of gas mixture 112 from the gas sources 110A and 110B), as well as the pneumatic connection of vacuum pump 46, to the reactor chamber interior 26. The valve 150 at the output end of gas source 110 adjacent the reactor chamber 20 is optional and may not be required given the low pressure in the reactor chamber interior 26.

The RE-ALD system 10 also includes a controller 200 operably connected to the oxygen plasma system 100 and the valves 150. The controller 200 is configured to control the operation of the RE-ALD system 10 to form the oxide film 142 on the upper surface 42 of substrate 40. In particular, the controller 200 is configured to control the opening and closing of the valves 150 as needed to control the operation of RE-ALD system 10. In an example, the controller 200 performs the sequential introduction of precursor gases 116 and 52 into the reactor chamber interior 26, including the removal of one precursor gas 116 or 52 before introducing the other precursor gas 116 or 52. In an example, the controller 200 controls the introduction of inert gas 62 as a purge gas to assist in removing one of the precursor gases 116 or 52 from the reactor chamber interior 26 prior to introducing the other precursor gas 116 or 52 into the reactor chamber interior 26. In another example, the controller 200 controls the mixture of $O_2$ and $CF_4$ and gases from respective gas sources 110A and 110б to form the desired gas mixture 112.

With reference to FIG. 2, the gas mixture 112 enters the input end 122 of plasma tube 120 and travels into the interior 126 of plasma tube 120. In the meantime, the RF source 134 provides the RF coil 130 with an RF-frequency signal that inductively forms the oxygen plasma 114 within the interior 126 of plasma tube 120. More specifically, as the gas mixture 112 flows towards the output end 123, the RF energy from the RF coil 130 drives azimuthal electrical currents in the (rarified) gas mixture 112, which initiates the formation of oxygen plasma 114 by the dissociation of diatomic oxygen $O_2$ into two oxygen radicals O*, along with the formation of residual species R. Because the output end 123 of plasma tube 120 is pneumatically connected to the reactor chamber interior 26, and because the reactor chamber interior 26 has a relatively low pressure, the oxygen plasma 114 is drawn into the reactor chamber interior 26 as the precursor gas 116.

In another example embodiment, the RE-ALD system 10 is configured for capacitive coupling to form the oxygen plasma 114, and the inductive coupling example is shown for the sake of illustration. The methods disclosed herein are not limited by the means by which the oxygen plasma 114 is formed.

Using a concentration of 0.1 vol % to 10 vol % of $CF_4$ gas with $O_2$ gas (e.g., the $CF_4$ gas makes up 1 to 10 vol % of the gas mixture 112 while the $O_2$ makes up the rest of the gas mixture 112) serves to increase the production of oxygen radicals O* in the oxygen plasma 114 as compared to when there is no $CF_4$ gas present. The precise mechanism for the $CF_4$ addition enhancing the O* generation is unknown. However, without being bound by theory, evidence suggests that the $CF_4$ acts to increases in the plasma density or electron temperature, which results in higher O* densities in the oxygen plasma 114 as compared to not using $CF_4$ in the gas mixture 112.

The use of greater amounts (concentrations) of $CF_4$ gas in the gas mixture 112 beyond 10 vol % can be problematic because the $CF_4$ (and in particular its constituent F) can start to participate the RE-ALD process when in fact the only role of the $CF_4$ in the gas mixture 112 is to enhance (i.e., increase) the production of oxygen radicals O* to improve the rate at which the RE-ALD process can be carried out in the RE-ALD system 10.

Thus, with continuing reference to FIGS. 1 and 2, in an example method, the RE-ALD is performed using the RE-ALD system 10 wherein the oxygen plasma 114 is formed from the gas mixture 112 of $CF_4$ and $O_2$ as disclosed above. The oxygen plasma 114 in turn generates oxygen radicals O* that constitute first precursor gas 116, wherein in an example the oxygen radicals O* are formed at a rate faster than the rate as compared to using only oxygen in the gas mixture 112. In example, the rate is between 1.1× and 2× the rate as compared to using only oxygen in the gas mixture 112.

The method then includes sequentially introducing the first precursor gas 116 and the second precursor gas 52 into the reactor chamber interior 26 to form the oxide film 142 on the upper surface 42 of a wafer. The sequential introduction of the precursor gases 116 and 52 is repeated to the extent needed to obtain a desired thickness for the oxide film 142. As noted above, the inert gas 62 as a purge gas can be employed to assist in purging the reactor chamber interior 26 of one precursor gas 116 or 52 before introducing the other precursor gas 116 or 52. It is noted that in FIG. 1, both precursor gases 116 and 52 as well as the inert gas 62 as purge gas are shown as being introduced at the same time into the reactor chamber interior 26 for ease of illustration.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A method of performing a radical-enhanced atomic-layer deposition (RE-ALD) process on a surface of a substrate that resides within an interior of a reactor chamber, comprising:
    providing a gas mixture of $CF_4$ gas and $O_2$ gas, wherein the $CF_4$ gas is present in a concentration in the range from 0.1 vol % to 10 vol %;
    forming a plasma from the gas mixture to generate oxygen radicals at a rate faster than if there were no $CF_4$ gas present in the gas mixture; and
    sequentially feeding the oxygen radicals and a precursor gas into the interior of the reactor chamber to form an oxide film on the surface of the substrate.

2. The method of claim 1, wherein the plasma is formed within a plasma tube that is pneumatically coupled to the interior of the reactor chamber.

3. The method of claim 1, wherein the precursor gas comprises a metal organic precursor.

4. The method of claim 3, wherein the metal organic precursor is selected from the group consisting of: silicon, aluminum, hafnium, titanium, zirconium, tantalum, yttrium and magnesium.

5. The method of claim 1, wherein the oxide film comprises a metal oxide.

6. The method of claim 5, wherein the metal oxide is selected from the group consisting of: $Al_2O_3$, $B_2O_3$, $CeO_2$, $Co_3O_4$, $Cr_2O_3$, $CuO_x$, $Er_2O_3$, $FeO_x$, $Ga_2O_3$, $Gd_2O_3$, $HfO_2$, $IrO_2$, $La_2O_3$, $MgO$, $Nb_2O_5$, $NiO_x$, $PtO_2$, $RuO_2$, $SiO_2$, $SnO_2$, $SrO_x$, $Ta_2O_5$, $TiO_2$, $Tm_2O_3$, $V_2O_5$, $Y_2O_3$, $ZnO$ and $ZrO_2$.

7. The method of claim 1, further comprising introducing a purge gas into the interior of the reactor chamber to assist in purging the interior of the reactor chamber of either the oxygen radicals or the precursor gas.

8. The method of claim 1, wherein the substrate comprises a silicon wafer.

9. A method of performing a radical-enhanced atomic-layer deposition (RE-ALD) process on a surface of a substrate that resides within an interior of a reactor chamber, comprising:
    providing a first precursor gas comprising oxygen radicals O* by forming an oxygen plasma from a gas mixture within a plasma tube, wherein the plasma tube is pneumatically coupled to the interior of the reactor chamber, and wherein the gas mixture consists of $CF_4$ gas and $O_2$ gas, wherein the $CF_4$ gas has a concentration of 0.1 vol % to 10 vol %;
    providing a second precursor gas from a gas source that is pneumatically coupled to the interior of the reactor chamber; and
    sequentially introducing the first precursor gas and the second precursor gas into the interior of the reactor chamber to form an oxide film on the surface of the substrate.

10. The method according to claim 9, wherein one of the first and second precursor gases comprises at least one of: silicon, aluminum, hafnium, titanium, zirconium, tantalum, yttrium and magnesium.

11. The method of claim 9, wherein the oxide film comprises one of: $SiO_2$, $Al_2O_3$, $HfO_2$, $TiO_2$, $ZrO_2$, $Ta_2O_5$, $Y_2O_3$ and MgO.

12. The method of claim 9, further comprising introducing a purge gas into the interior of the reactor chamber to assist in purging the interior of the reactor chamber of either the first precursor gas or the second precursor gas.

13. The method of claim 9, wherein the substrate comprises a silicon wafer.

14. The method of claim 9, wherein the plasma tube is made of quartz.

15. The method of claim 9, wherein forming the oxygen plasma includes subjecting the gas mixture in the plasma tube to inductive coupling.

16. A system for performing a radical-enhanced atomic-layer deposition (RE-ALD) process on a surface of a substrate, comprising:
    a reactor chamber having an interior configured to support the substrate;
    a gas source pneumatically coupled to the interior of the reactor chamber and that contains a gas mixture consisting of $CF_4$ and $O_2$, wherein the $CF_4$ has a concentration in the gas mixture of 0.1 vol % to 10 vol %;

a plasma system pneumatically connected to the interior of the reactor chamber and configured to form from the gas mixture a plasma that generates oxygen radicals O* faster than if the gas mixture did not contain $CF_4$;

a vacuum pump pneumatically connected to the interior of the reactor chamber; and a controller operably connected to the plasma system, the vacuum pump and the gas source, the controller being configured to introduce the oxygen radicals and a precursor gas sequentially into the interior of the reactor chamber to form an oxide film on the surface of the substrate.

17. The system according to claim 16, wherein the gas includes one of: silicon, aluminum, hafnium, titanium, zirconium, tantalum, yttrium and magnesium.

18. The system according to claim 16, wherein the plasma system includes an inductively coupled plasma source.

19. The system according to claim 16, further comprising the substrate, wherein the substrate comprises silicon.

20. The system according to claim 16, wherein the gas source includes operably coupled first and second gas sources, wherein the first gas source contains the $O_2$ gas and the second gas source contains the $CF_4$ gas.

* * * * *